(12) United States Patent
Chambion et al.

(10) Patent No.: US 10,658,420 B2
(45) Date of Patent: May 19, 2020

(54) METHOD FOR MASS-PRODUCTION OF CURVED ELECTRONIC CIRCUITS

(71) Applicant: COMMISSARIAT A L'ENERGIE ATOMIQUE ET AUX ENERGIES ALTERNATIVES, Paris (FR)

(72) Inventors: Bertrand Chambion, Poncharra (FR); Emmanuel Hugot, Marseilles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/477,925

(22) PCT Filed: Jan. 17, 2018

(86) PCT No.: PCT/FR2018/050113
§ 371 (c)(1),
(2) Date: Jul. 15, 2019

(87) PCT Pub. No.: WO2018/134520
PCT Pub. Date: Jul. 26, 2018

(65) Prior Publication Data
US 2019/0371854 A1    Dec. 5, 2019

(30) Foreign Application Priority Data
Jan. 18, 2017    (FR) ..................................... 17 50377

(51) Int. Cl.
*H01L 27/146*    (2006.01)
(52) U.S. Cl.
CPC .. *H01L 27/14683* (2013.01); *H01L 27/14607* (2013.01)
(58) Field of Classification Search
None
See application file for complete search history.

(56) References Cited

U.S. PATENT DOCUMENTS

| | | | |
|---|---|---|---|
| 7,507,944 B1 * | 3/2009 | Arnzen | H01L 27/14603 250/208.1 |
| 9,859,314 B2 * | 1/2018 | McKnight | H01L 27/14607 |

(Continued)

FOREIGN PATENT DOCUMENTS

| | | |
|---|---|---|
| EP | 2 320 469 A1 | 5/2011 |
| EP | 3 093 634 A1 | 11/2016 |
| WO | WO 2012/172251 A1 | 12/2012 |

OTHER PUBLICATIONS

International Search Report dated May 4, 2018 in PCT/FR2018/050113 filed on Jan. 17, 2018.
French Preliminary Search Report dated Sep. 21, 2017 in French Application 1750377 filed on Jan. 18, 2017.

(Continued)

*Primary Examiner* — J. E. Schoenholtz
(74) *Attorney, Agent, or Firm* — Oblon, McClelland, Maier & Neustadt, L.L.P.

(57) ABSTRACT

A method for producing a plurality of curved electronic circuits includes: producing a support including a plurality of membranes made from at least one material having a rigidity of more than around 100 MPa, each intended for being part of one of the electronic circuits and having a radius of curvature R between about 15 mm and 500 mm; applying a force to one of the main surfaces of each of the membranes, so that the membrane deforms resiliently and has a substantially planar shape when exposed to the force; rigidly connecting at least one electronic component to each of the membranes; and removing the force applied to one of the main faces of each of the membranes so that each of the membranes retrieves its original radius of curvature R and curves the electronic component according to this radius of curvature R.

11 Claims, 2 Drawing Sheets

(56) References Cited

U.S. PATENT DOCUMENTS

| | | |
|---|---|---|
| 10,304,880 B2* | 5/2019 | Kim ............... H04N 5/3696 |
| 2006/0038183 A1 | 2/2006 | Oliver |
| 2006/0186492 A1 | 8/2006 | Boettiger et al. |
| 2007/0096235 A1 | 5/2007 | Boettiger et al. |
| 2007/0120212 A1 | 5/2007 | Boettiger et al. |
| 2009/0045510 A1 | 2/2009 | Naya |
| 2011/0108180 A1 | 5/2011 | Fendler et al. |
| 2011/0149423 A1 | 6/2011 | Lasfargues et al. |
| 2014/0160327 A1 | 6/2014 | Enoki et al. |
| 2016/0086994 A1 | 3/2016 | Guenter |
| 2016/0286102 A1 | 9/2016 | Sulfridge et al. |
| 2016/0358971 A1 | 12/2016 | Gaeremynck et al. |

OTHER PUBLICATIONS

Chambion, B. et al., "Tunable curvature of large visible CMOS image sensors: Towards new optical functions and system miniaturization," 2016, IEEE 66th Electronic Components and Technology Conference (ECTC), Total 10 pages.

Heung, C. K. et al., "A hemispherical electronic eye camera based on compressible silicon optoelectronics," Nature, Letters, vol. 454, Aug. 7, 2008, doi:10.1038/nature07113, pp. 748-753.

Ferrari, M., "Development of a variable curvature mirror for the delay lines of the VLT interferometer," Astronomy & Astrophysics Supplement Series, vol. 128, 1998, pp. 221-227.

U.S. Appl. No. 16/179,355, filed Nov. 2, 2018, US 2019/0140008 A1, Bertrand Chambion, et al.

U.S. Appl. No. 16/472,037, filed Dec. 18, 2017, Bertrand Chambion, et al.

* cited by examiner

METHOD FOR MASS-PRODUCTION OF CURVED ELECTRONIC CIRCUITS

FIELD OF THE INVENTION AND PRIOR ART

The invention relates to the mass-production of curved, i.e. non-planar, electronic circuits, as well as that of the production of electronic devices including such curved electronic circuits coupled with optical systems, for example of the imager (or sensor) or display type.

An electronic device such as a sensor or a display includes an optical system, generally formed of a plurality of lenses, coupled with an electronic circuit intended to carry out an emission or detection of light via the optical system. The electronic circuit includes a substrate whereon a plurality of electronic components are produced.

Curving the electronic circuit is a solution that makes it possible to simplify the optical system significantly, by reducing particularly the number of lenses required by the optical system, which enables a more compact embodiment of the optical system. An example of simplification of wide-angle optics is described for example in the document "Tunable curvature of large visible CMOS image sensors: Towards new optical functions and system miniaturization" by B. Chambion et al., 2016 IEEE 66th Electronic Components and Technology Conference (ECTC).

The substrates from which the electronic components of the circuits are produced generally comprise silicon. The packaging techniques and methods make it possible to reduce the thickness of the substrate to relatively small thicknesses (a few microns). To produce a curved electronic circuit, once the substrate of the components of the circuits has been thinned to the desired thickness, the electronic circuit is packaged, or assembled, on a support which is compatible with the curvature sought.

In the document cited above by B. Chambion et al, there is described a particular support whereon the electronic circuit is bonded. The curvature is subsequently obtained by applying locally a force to the support, at the centre of the side opposite that where the electronic circuit is located. In this method, it is however necessary for the force curving the support to be constantly applied on the support, which is a significant constraint.

The document US 2014/0160327 A1 describes the use of a support wherein a cavity is formed. An electronic circuit is arranged on the support, on top of the cavity. The circuit is then curved by setting this cavity under negative pressure conditions, and immobilised in this position by adhesive injected between the circuit and the support. This solution only makes it possible however to obtain a spherical curvature at a central part of the circuit. Furthermore, it gives rise to considerable mechanical stress at the edges of the electronic circuit, which weakens same.

Alternatively, the document WO 2012/172251 A1 describes the production of a curved electronic circuit using a support formed of two materials having different coefficients of thermal expansion. The curvature is obtained by a bimetal effect between the two materials which have different thermomechanical behaviours. This method is not however suitable for mass-production of a plurality of curved electronic circuits since the different electronic circuits produced from the same substrate must be cut before each being arranged individually on a support. Furthermore, the choice of the degree of curvature of the circuits is made by adjusting the temperature to which the support is subjected, which is restrictive particularly when the electronic circuit corresponds to an imager in that the operation thereof is extremely temperature-sensitive (an increase in temperature carried out to adjust the curvature degrades the quality of the image supplied by the imager due to the increase in the noise generated by the increase in temperature).

The documents US 2011/0149423 A1, US 2009/0045510 A1 and EP 2 320 469 A1 describe further methods for curving electronic circuits. However, none of these methods is suitable for the mass-production of a plurality of curved electronic circuits.

The document US 2006/0038183 A1 describes a method for curving collectively a plurality of electronic circuits produced on the same substrate. For this, a compartment containing a fluid is positioned under each circuit so as to apply a hydrostatic force under each circuit. The curvature of the circuits is obtained by means of this hydrostatic force. This method has however a number of drawbacks. Indeed, the curvature obtained varies with the temperature to which the fluid is subjected. It is therefore difficult to obtain a precise curvature of the electronic circuits. Furthermore, this solution is not reliable as in the event the fluid leakage, the curvature of the circuits must be readjusted.

The document "A hemispherical electronic eye camera based on compressible silicon optoelectronics" by Heung Cho Ko et al., Nature Letters, vo. 454/7, Jul. 8, 2008, describes a method for producing an imager wherein a curved PDMS membrane is constrained to render same planar prior to bonding components on this membrane. The electronic circuit bonded on the membrane is particular in that it is formed of a plurality of electronic components produced on the portions of silicon which do not form a single substrate but which are interconnected by distinct interconnection elements. After this bonding, the stress on the membrane is released so that the latter returns to the initial shape thereof.

Here again, such a method has a number of drawbacks. Firstly, this method can only be carried out for the particular electronic circuit described in this document and formed by multiple components interconnected by interconnections suitable for being compressed. This method is not suitable for curving directly the electronic components mounted on the membrane as it is the interconnections that, by being compressed, follow the curvature of the membrane. When each component is considered individually, these components are not curved. Furthermore, during the method, the membrane is flattened by applying a lateral force on the entire periphery of the membrane. This method is therefore not compatible with mass-production of a plurality of curved electronic circuits. Furthermore, building the circuit with multiple discrete components does not make it possible to obtain a high-resolution system.

DESCRIPTION OF THE INVENTION

An aim of the present invention is that of providing a method for mass-production of a plurality of curved electronic circuits not involving the drawbacks of the prior art, i.e.:
- wherein the curvature is applied to the electronic components of the circuits without having to hold an external force on the support of the components,
- which is compatible with obtaining a spherical curvature on the entire surface of the electronic components,
- which does not weaken the edges of the electronic circuits,
- wherein the dependency of the curvature of the electronic circuits with respect to the temperature is reduced or removed, which is suitable for curving the electronic components of the circuits directly according to a radius of curvature applied by the support.

For this, the present invention relates to a method for the production of a plurality of curved electronic circuits, comprising:

producing a support comprising a plurality of membranes made from at least one material having a rigidity, or a Young's modulus, greater than about 100 MPa, each intended for being part of one of the electronic circuits and having a radius of curvature R between about 15 mm and 500 mm;

applying a force to one of the main faces of each of the membranes such that said membrane is deformed elastically, or resiliently, and has a substantially planar shape under the effect of this force;

rigidly connecting of at least one electronic component to each of the membranes;

removing the force applied to one of the main faces of each of the membranes such that each of the membranes retrieves its original radius of curvature R and curves the electronic component according to this radius of curvature R.

The curvature of the electronic circuits is obtained herein by means of a temporary storage of elastic energy in the membranes. The curvature of the membranes at rest corresponds to the final curvature sought for the electronic circuits. After the production thereof, the membranes are constrained to exhibit a planar surface, making it possible to carry out the bonding or "flat" mounting of the electronic component(s) of each electronic circuit which form for example a sensor or a display. Once the force has been removed, the membranes return to the initial position thereof that they apply to the electronic components, thus forming the curved electronic circuits.

The membranes and the force applied on these membranes during the method are such that the membranes are elastically deformed, i.e. deformed in a reversible manner. Thus, after the removal of the force applied on each of the membranes, they return to the initial shape thereof without breaking or plastic deformation.

In this method, because the force is applied to one of the main faces of each of the membranes and not to the sides, or lateral faces, of the membranes, the deformation of the membranes may be obtained simultaneously for all the membranes, which renders the method compatible with mass-production of the curved electronic circuits.

Furthermore, the material of the membranes has a significant rigidity which enables the membranes to apply to the electronic components the curvature thereof, even when the electronic components are produced on thinned silicon substrate portions, these thinned substrate portions being therefore also curved by the membranes. The significant rigidity of the material of the membranes also makes it possible to render the method compatible with a significant curvature of the electronic circuits, corresponding to obtaining a radius of curvature R between about 15 mm and 500 mm.

Moreover, the initial production of the membranes with the curvature sought renders the method compatible with obtaining a spherical curvature on the entire surface of each electronic circuit.

Furthermore, while remaining in the elastic deformation range, no weakening of the edges of the membranes occurs.

Moreover, this method does not use materials having different CTEs (coefficient of thermal expansion) to obtain the curvature sought by bimetal effect, which renders the curvature of the electronic circuits independent of the temperature to which the electronic circuits are subjected. The curvature obtained is also more precise.

This method is compatible with a concave or convex curvature of the electronic components of the curved circuits produced.

The material of the membranes may be a plastic material and the support may be produced by moulding or by 3D printing. Alternatively, the material of the membranes may be a metallic material and the support may be produced by machining or by embossing.

The force applied to said one of the main faces of each of the membranes may be a hydrostatic force applied on all of said main face, or a local force.

Each of the membranes may have a spherical or cylindrical curvature.

When each of the membranes has a spherical curvature and the force applied is local, each of the membranes may include a decreasing variable thickness (optionally linear) from the centre of the membrane to the edges of the membrane. In other words, the thickness of each membrane at the centre thereof is greater than the thickness thereof at the edges thereof. Such a variable thickness makes it possible to obtain a spherical curvature even when the force applied is local.

The force may be applied to a first of the main faces of each of the membranes and each electronic component may be rigidly connected, or attached, to a second of the main faces of each of the membranes, opposite the first of the main faces.

Each electronic component may be rigidly connected to one of the membranes by means of at least one bonding layer.

The method may further include, after the step of removing the force applied to one of the main faces of each of the membranes, a step of cutting the support detaching the electronic circuits from one another.

The invention also relates to a method for producing electronic devices, including the implementation of a method for producing electronic circuits as described above, followed by a step of coupling each electronic circuit with an optical system, forming the electronic devices.

BRIEF DESCRIPTION OF THE DRAWINGS

The present invention will be understood more clearly on reading the description of examples of embodiments given merely by way of indication and not limitation with reference to the appended drawings wherein.

Identical, similar or equivalent parts of the various figures described hereinafter bear the same reference numbers so as to facilitate the transition from one figure to another.

The various parts shown in the figures are not shown according to a uniform scale, to render the figures more legible.

The various possibilities (variants and embodiments) should be understood as not being exclusive from one another and may be combined with one another.

DETAILED DESCRIPTION OF PARTICULAR EMBODIMENTS

Reference is firstly made to FIGS. 1 to 4 which show the steps of a method for producing a plurality of curved electronic circuits 100, according to a particular embodiment. In this particular embodiment, the electronic circuits 100 correspond to CMOS imagers wherein the electronic components are produced beforehand on a thinned silicon substrate having a thickness compatible with a concave spherical curvature wherein the final radius of curvature is R, where R>15 mm and R<500 mm. The electronic circuits 100 may also correspond to CCD imagers, or any other electronic circuit.

In the method described herein, a plurality of curved electronic circuits 100 are mass-produced from the same support 102.

Figure 1:
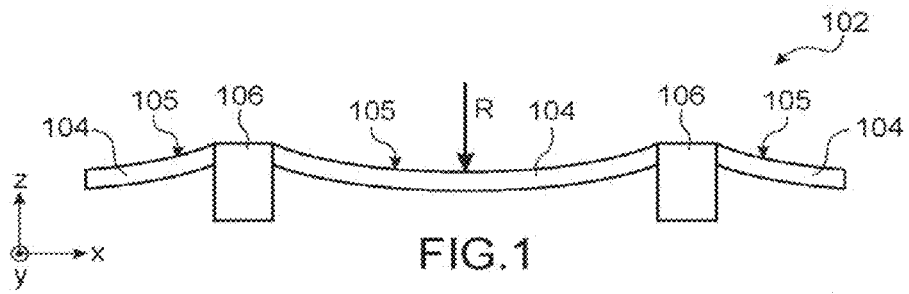
FIGS. 1 to 4 show the steps of a method for producing a curved electronic circuit, according to the present invention, according to a particular embodiment.

As shown in FIG. 1, the support 102 is first produced. This support 102 is intended to receive the electronic components of the electronic circuits 100 and to give the curved shape sought to these electronic components.

The support 102 includes a plurality of membranes 104, each being intended to receive the electronic components (herein forming a CMOS imager) of one of the electronic circuits 100 on a top face 105 of one of the membranes 104. The edges, or peripheral parts, of the membranes 104 are connected to thicker portions of the support 102 which form holding portions 106 of the membranes 104.

The membranes 104 may be viewed as being suspended from the holding portions 106. Each of the membranes 104 has for example, in the main plane of the support 102 (plane (X,Y) in FIG. 1), a substantially circular or square or rectangular shape.

Each of the membranes 104 is curved and has a radius of curvature R between about 15 mm and 500 mm, or between about 85 mm and 500 mm, or between about 250 mm and 500 mm, or between about 280 mm and 500 mm.

Figure 5:
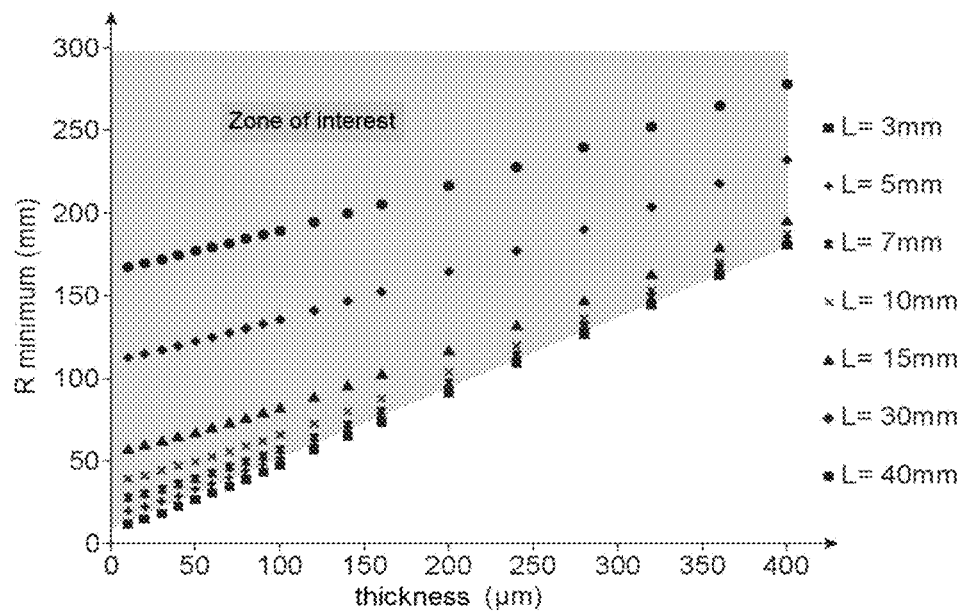
FIG. 5 shows values of the minimum radius of curvature that may be obtained in the method for producing a curved electronic circuit, according to the present invention, according to the dimensions of a substrate whereon the electronic components of the circuit are produced.

The minimum radius of curvature R suitable for being obtained by this method is dependent particularly on the material and the dimensions of the substrate whereon the electronic components are produced. FIG. 5 shows the minimum radius of curvature R, in mm, suitable for being obtained when the electronic components are produced on a thinned silicon substrate, according to the thickness (in microns in FIG. 5) of this substrate. These values are obtained by considering a square-shaped silicon substrate wherein the sides have each a length L. In FIG. 5, the minimum radius of curvature values are given for different values of L. It is seen in FIG. 5 that a value of R slightly greater than 15 mm is obtained for a square-shaped silicon substrate of sides of dimension L=3 mm and of thickness equal to about 10 μm.

The support 102 is for example produced from a metallic material.

In this case, the support 102 is produced for example by machining or assembled by embossing in order to form curved membranes 104 according to a radius of curvature R corresponding to the final radius of curvature whereby the electronic components of the electronic circuits 100 are intended to be curved.

Alternatively, the material of the support 102 may correspond to a plastic material. In this case, the support 102 may be produced by moulding or by 3D printing.

In any case, whether the material of the support 102 is metallic or plastic, this material is chosen such that the rigidity thereof, or Young's modulus, is greater than about 100 MPa. Such a metallic material includes for example steel, and such a plastic material corresponds for example to a thermoplastic material (comprising for example at least one of the following materials: polyethylene, polypropylene, ABS for Acrylonitrile Butadiene Styrene, etc.) and/or thermosetting (comprising for example at least one of the following materials: epoxy resin, polyester, polyurethane, etc.).

Such rigidity will make it possible, subsequently in the course of the method, to curve the semiconductor substrate whereon the electronic components of each circuit 100 are produced.

Figure 2:
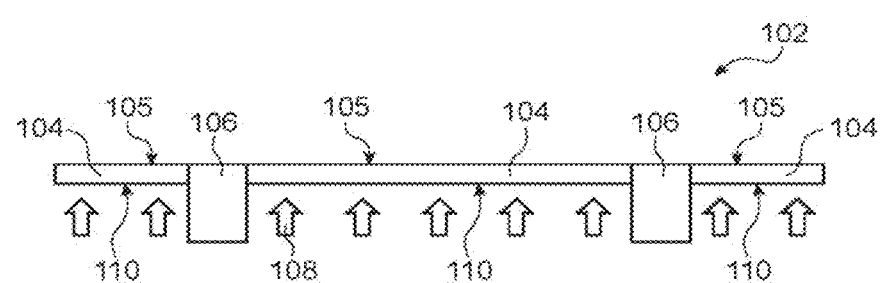

A force F, represented schematically by arrows bearing the reference 108 in FIG. 2, is then applied on one of the main faces of the membranes 104, corresponding to the bottom faces 110 of the membranes 104 in this example of an embodiment. This force F is such that the membranes 104 subjected to this force are deformed plastically and become substantially planar (the faces 105, 110 belong to parallel planes to the main plane of the support 102 (plane (X,Y))). This force F corresponds for example to a hydrostatic pressure applied by a fluid on the entire surface of the bottom face 110 of each of the membranes 104. On each of the membranes 104, the force F applied is for example between 10 kg and 30 kg, the exact value being dependent particularly on the material and dimensions of the membranes 104, as well as on the value of the radius of curvature R.

The intensity of the force F to be applied may predetermined by analytical computing, as described in the document "Development of a variable curvature mirror for the delay lines of the VLT interferometer" by M. Ferrari, Astron. Astrophys. Suppl. ser. 128, 221-227, 1998, "optical results" section, page 225-227. Alternatively, the force F may not be predetermined in advance and be applied progressively to the membranes 104. Obtaining the flatness of the membranes 104 may then be checked dynamically by optical measurement methods such as a confocal measurement or by a Fizeau interferometer, or mechanical measurements such as a mechanical probe or stylus measurement.

The increase in the force F is stopped when the flatness of the membranes 104 is obtained.

Figure 3:
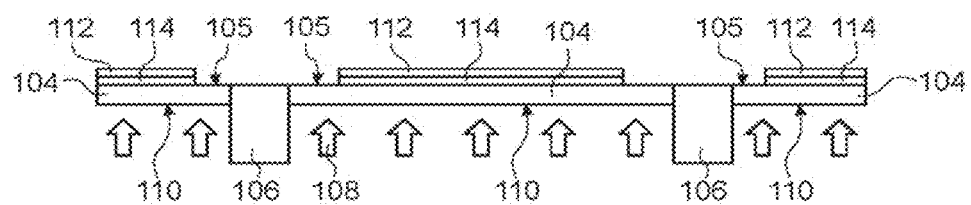

As shown in FIG. 3, the electronic components 112 of the electronic circuits 100 are mounted on the membranes 104 kept in a planar state by the force F. The electronic components 112 of each electronic circuit 100 form for example, for each electronic circuit 100, an image sensor. The electronic components 112 are produced on a substrate suitable for being curved without breaking, comprising for example a semiconductor such as silicon, and wherein the thickness is for example less than about 400 μm.

In the embodiment described herein, the electronic components 112 are mounted on the top faces 105 of the membranes 104. The electronic components 112 are for example rigidly connected to the membranes 104 by means of an attachment, or connecting, layer 114, corresponding for example to a layer of adhesive. The layer of adhesive 114 has for example a thickness equal to about 75 μm, or more generally greater than about 30 μm. The bonding of the electronic components 112 on the top faces 105 of the membranes 104 may be carried out in accordance with the method described in the document EP 3 093 634 A1, and particularly with a layer of adhesive having a Young's module between about 20 MPa and 80 MPa, which makes it possible to reduce the risk of breakage of the electronic circuits 100, with a subsequent adhesive hardening step, for example by cross-linking or drying of the adhesive.

Alternatively, any other attachment technique may be used for mounting the electronic components 112 against the membranes 104.

Figure 4:
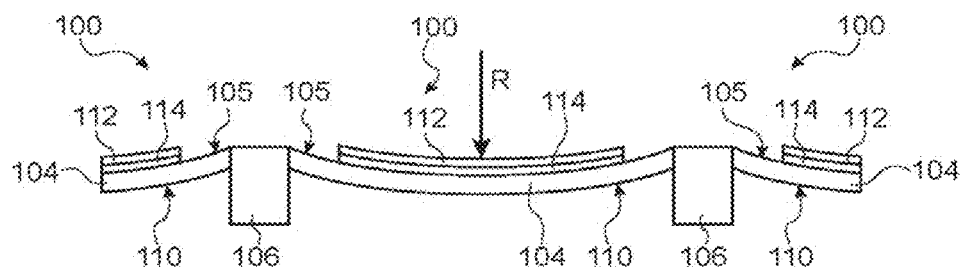

Then, the force F is progressively removed and the membranes 104 progressively return to the initial shape thereof, thus applying the radius of curvature R thereof to the electronic components 112 mounted on the surface thereof without damaging the electronic circuits 100 (FIG. 4). The elastic energy stored in the membranes 104 is released, curving the various electronic circuits 100 produced.

By means of the thick layer of adhesive, the stress applied to the electronic components 112 is reduced when the force F is removed and the electronic components 112 are curved. This reduces the risk of degradation of the electronic components 112.

The production of the electronic circuits 100 is completed by cutting the support 102 at the various holding portions 106 whereon the electronic components 112 are not present, which separates the electronic circuits 100 from one another. Further steps of protecting the electronic components 112 or of carrying out wired cabling may also be carried out.

As an alternative embodiment of the method described above wherein the force F applies a pressure on the bottom faces 110 of the membranes 104 upon the mounting of the electronic components 112 on the membranes 104, the rear faces 110 of the membranes 104 may be subjected, upon the mounting of the electronic components 112, to a negative pressure force, for example hydrostatic. This case applies when the initial curvature of the membranes 104 is opposite that described above with reference to FIG. 1, i.e. such that the top faces 105 have a convex shape with respect to the main plane of the membranes 104. The negative pressure then applied on the rear faces 110 of the membranes 104 is such that the membranes 104 are in a substantially planar deformation state enabling the mounting of the electronic components 112 on the non-curved faces 105. After the removal of this negative pressure force, the electronic components 112 are in a convex curvature state (at the top face thereof).

According to a further alternative embodiment, the force F may correspond to a local pressure applied on the bottom face 110 of each of the membranes 104, for example at a central region of the bottom face 110 of each of the membranes 104. In this case, if a spherical curvature of the membranes 104 is sought, each of the membranes 104 is produced with a variable thickness in order to distribute as uniformly as possible the local force over all of each of the membranes 104. For example, this thickness may be decreasing from the centre of each of the membranes 104 to the edges of the membranes 104. In other words, the maximum thickness of each membrane 104 may be located substantially at the centre of each of the membranes 104, where the force F is intended to be applied, the minimum thickness being situated at the edges of the membranes 104 which are in contact with the holding portions 106. Alternatively, the membranes 104 may be such that the top faces 105 have a convex shape with respect to the main plane of the membranes 104, and a local force F pulling the membranes 104 at the level of the top face 105 thereof is applied.

According to a further alternative embodiment, the curvatures of the electronic circuits 100 may not be spherical but cylindrical (concave or convex). In this case, for tightness reasons, the force F applied to deform the membranes 104 upon the mounting of the electronic components 112 corresponds to a mechanical and not hydrostatic bearing force.

According to a further alternative embodiment, the electronic components 112 may be mounted on the rear faces 110 of the membranes 104. In this case, the membranes 104 are deformed by applying the force F on the front faces 105 of the membranes 104.

Figure 6:
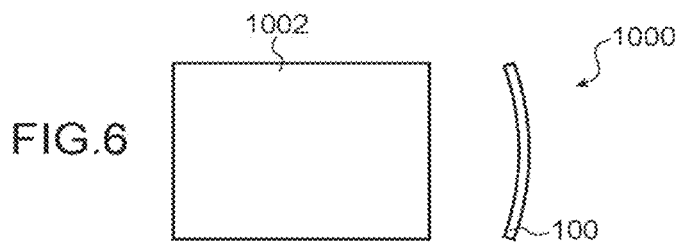
FIG. 6 shows schematically an electronic device obtained using a method according to the invention.

The curved electronic circuits 100 thus produced are used for the production of electronic devices 1000 such as that shown schematically in FIG. 6. In this figure, the electronic device 1000 corresponds to an imager comprising a curved electronic circuit 100 forming an image sensor optically coupled with an optical system 1002 comprising a plurality of lenses focusing a light received on the electronic components of the circuit 100.

Figure 7:
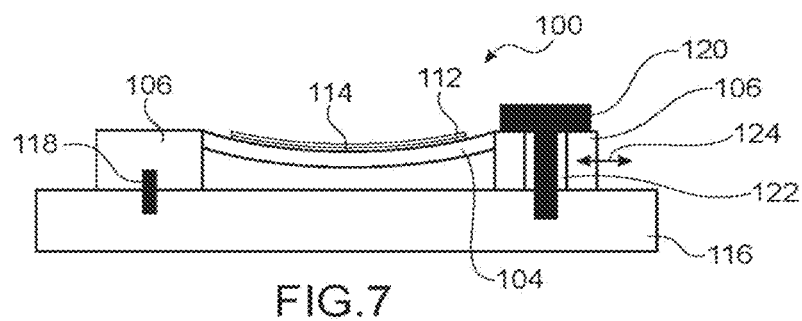
FIG. 7 shows schematically an electronic circuit obtained using a method according to the invention and rigidly connected to a support.

The curved electronic circuit 100 obtained may also be attached to a support 116, as shown for example in FIG. 7. The holding portions 106 of the electronic circuit 100 are in this case secured to the support 116.

When the support 116 includes a material having a different CTE to that of the holding portions 106, the electronic circuit 100 may be secured to the support 116 by particular holding means suitable for guaranteeing an insensitivity of the curvature of the electronic circuit 100 with respect to temperature variations. In the example shown in FIG. 7, these holding means correspond to a positioning rod 118, or centring rod, forming a fixed positioning point of the electronic circuit 100 on the support 116, and a further attachment means 120 mechanically holding the electronic circuit 100 on the support 116 while allowing relative sliding of the electronic circuit 100 on the support 116 upon a temperature variation inducing a thermal expansion. In FIG. 7, this holding means 120 corresponds to a screw 120 and a hole 122 formed in the electronic circuit and having larger dimensions than those of the screw 120, allowing a movement represented symbolically by the arrow 124.

The invention claimed is:

1. A method for producing a plurality of curved electronic circuits, comprising:
   producing a support comprising a plurality of membranes made from at least one material having a rigidity, or a Young's modulus, greater than 100 MPa, each configured to be part of one of the electronic circuits and having a radius of curvature R between about 15 mm and 500 mm;
   applying a force to one of the main faces of each of the membranes such that said membrane is deformed elastically and has a substantially planar shape under the effect of the force;
   rigidly connecting at least one electronic component to each of the membranes; and
   removing the force applied to one of the main faces of each of the membranes such that each of the membranes retrieves the original radius of curvature R and curves the electronic component according to the radius of curvature R.

2. The method according to claim 1, wherein the material of the membranes is a plastic material and the support is produced by moulding or by 3D printing, or wherein the material of the membranes is a metallic material and the support is produced by machining or by embossing.

3. The method according to claim 1, wherein the force applied to said one of the main faces of each of the membranes is a hydrostatic force applied on all of said main face, or a local force.

4. The method according to claim 1, wherein each of the membranes has a spherical or cylindrical curvature.

5. The method according to claim 1, wherein each of the membranes has a spherical curvature, wherein the force applied to said one of the main faces of each of the membranes is a local force, and wherein each of the membranes includes a decreasing variable thickness from the centre of the membrane to the edges of the membrane.

6. The method according to claim 1, wherein the force is applied on a first of the main faces of each of the membranes and each electronic component is rigidly connected to a second of the main faces of each of the membranes, opposite the first of the main faces.

7. The method according to claim 1, wherein each electronic component is rigidly connected to one of the membranes by at least one bonding layer.

8. The method according to claim 1, further comprising, after the removing the force applied to one of the main faces of each of the membranes, cutting the support detaching the electronic circuits from one another.

9. A method for producing electronic devices, comprising:
implementing the method for producing electronic circuits according to claim 8; and
after the implementing, coupling each electronic circuit with an optical system, forming the electronic devices.

10. The method according to claim 1, wherein the material of the membranes is steel.

11. The method according to claim 1, wherein the material of the membranes is a thermoplastic material.

* * * * *